United States Patent
Schediwy et al.

(10) Patent No.: US 9,057,653 B2
(45) Date of Patent: Jun. 16, 2015

(54) INPUT DEVICE WITH FORCE SENSING

(75) Inventors: Richard R. Schediwy, Union City, CA (US); Robert J. Bolender, San Jose, CA (US); Adam Schwartz, Redwood City, CA (US); Fritz Norby, Felton, CA (US); Shawn P. Day, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 372 days.

(21) Appl. No.: 12/777,829

(22) Filed: May 11, 2010

(65) Prior Publication Data

US 2011/0278078 A1    Nov. 17, 2011

(51) Int. Cl.
*G06F 3/044*    (2006.01)
*G06F 3/045*    (2006.01)
*G01L 1/14*    (2006.01)
(Continued)

(52) U.S. Cl.
CPC .............. *G01L 1/146* (2013.01); *G06F 3/0414* (2013.01); *G06F 2203/04106* (2013.01); *G06F 2203/04104* (2013.01); *G06F 3/044* (2013.01); *H03K 17/98* (2013.01)

(58) Field of Classification Search
CPC ..... G06F 3/044; G06F 3/04886; G06F 3/041; G06F 2203/04111; G06F 2203/04104; G06F 2203/04808; G06F 3/0414; G06F 2203/04101; G06F 3/0488; G06F 3/0416; H03K 2217/960725; H03K 17/9622
USPC ..................... 178/18.01, 18.03, 18.06, 20.01; 345/173, 174, 178, 156; 73/862.626, 73/780; 702/41, 104; 324/661; 200/600
See application file for complete search history.

(56) References Cited

U.S. PATENT DOCUMENTS

| 4,290,052 A | 9/1981 | Eichelberger et al. |
| 4,719,538 A | 1/1988 | Cox |
| 5,492,020 A | 2/1996 | Okada |

(Continued)

FOREIGN PATENT DOCUMENTS

| JP | 7280671 A | 10/1995 |
| JP | 2009009249 A1 | 1/2001 |

(Continued)

OTHER PUBLICATIONS

International Bureau, International Search Report and Written Opinion for International Application No. PCT/US2012/052909 dated Dec. 26, 2012.

(Continued)

*Primary Examiner* — Michael J Eurice
(74) *Attorney, Agent, or Firm* — Osha Liang LLP

(57) ABSTRACT

Devices and methods are provided that utilize a first electrode disposed on a first substrate and a second electrode disposed on a second substrate, where the first electrode and the second electrode define at least part of a variable capacitance. A third substrate is arranged between the first substrate and the second substrate, the third substrate having an opening arranged such that at least a portion of the first electrode and the second electrode overlap the opening. A transmission element is provided that partially overlaps the opening. The transmission element is physically coupled to the second electrode such that a force biasing the transmission element causes the second electrode to deflect relative to the first electrode, thus changing the variable capacitance. A measurement of the variable capacitance may then be used to determine force information.

6 Claims, 12 Drawing Sheets

(51) Int. Cl.
*G06F 3/041* (2006.01)
*H03K 17/98* (2006.01)

(56) References Cited

U.S. PATENT DOCUMENTS

| | | | |
|---|---|---|---|
| 5,510,813 A | 4/1996 | Makinwa et al. | |
| 5,854,625 A | 12/1998 | Frisch et al. | |
| 5,942,733 A | 8/1999 | Allen et al. | |
| 5,945,980 A | 8/1999 | Moissev et al. | |
| 5,973,668 A | 10/1999 | Watanabe | |
| 6,002,389 A * | 12/1999 | Kasser | 345/173 |
| 6,125,476 A | 10/2000 | Jerome | |
| 6,215,476 B1 | 4/2001 | Depew et al. | |
| 6,642,857 B1 | 11/2003 | Schediwy et al. | |
| 6,888,537 B2 | 5/2005 | Benson et al. | |
| 6,958,614 B2 * | 10/2005 | Morimoto | 324/661 |
| 7,047,818 B2 | 5/2006 | Dallenbach et al. | |
| 7,148,882 B2 | 12/2006 | Kamrath et al. | |
| 7,196,694 B2 | 3/2007 | Roberts | |
| 7,398,587 B2 * | 7/2008 | Morimoto | 29/592.1 |
| 7,451,659 B2 | 11/2008 | Dallenbach et al. | |
| 7,499,040 B2 | 3/2009 | Zadesky et al. | |
| 7,656,465 B2 | 2/2010 | Takeda et al. | |
| 7,728,487 B2 | 6/2010 | Adachi et al. | |
| 7,743,667 B2 | 6/2010 | Harish et al. | |
| 7,784,366 B2 | 8/2010 | Daverman et al. | |
| 7,786,655 B2 | 8/2010 | Park et al. | |
| 7,903,091 B2 | 3/2011 | Lee et al. | |
| 8,120,229 B2 | 2/2012 | Huang | |
| 8,169,416 B2 | 5/2012 | Han | |
| 8,698,769 B2 | 4/2014 | Coulson et al. | |
| 2002/0019711 A1 | 2/2002 | Miyashita et al. | |
| 2002/0180710 A1 | 12/2002 | Roberts | |
| 2003/0151589 A1 * | 8/2003 | Bensen et al. | 345/156 |
| 2004/0112149 A1 | 6/2004 | Gebert | |
| 2004/0155991 A1 * | 8/2004 | Lowles et al. | 349/12 |
| 2004/0227736 A1 | 11/2004 | Kamrath et al. | |
| 2005/0052425 A1 * | 3/2005 | Zadesky et al. | 345/173 |
| 2005/0057266 A1 * | 3/2005 | Morimoto | 324/661 |
| 2005/0057528 A1 * | 3/2005 | Kleen | 345/173 |
| 2005/0061082 A1 * | 3/2005 | Dallenbach et al. | 73/780 |
| 2006/0017701 A1 * | 1/2006 | Marten et al. | 345/173 |
| 2006/0197753 A1 * | 9/2006 | Hotelling | 345/173 |
| 2007/0063982 A1 * | 3/2007 | Tran | 345/173 |
| 2007/0229464 A1 * | 10/2007 | Hotelling et al. | 345/173 |
| 2007/0229470 A1 * | 10/2007 | Snyder et al. | 345/173 |
| 2007/0236450 A1 * | 10/2007 | Colgate et al. | 345/156 |
| 2007/0257821 A1 * | 11/2007 | Son et al. | 341/22 |
| 2007/0268265 A1 * | 11/2007 | XiaoPing | 345/173 |
| 2008/0018608 A1 * | 1/2008 | Serban et al. | 345/173 |
| 2008/0018611 A1 * | 1/2008 | Serban et al. | 345/173 |
| 2008/0062148 A1 | 3/2008 | Hotelling et al. | |
| 2008/0068348 A1 * | 3/2008 | Rosenberg et al. | 345/173 |
| 2008/0142352 A1 * | 6/2008 | Wright | 200/600 |
| 2008/0190210 A1 | 8/2008 | Harish et al. | |
| 2008/0202251 A1 * | 8/2008 | Serban et al. | 73/780 |
| 2008/0202824 A1 | 8/2008 | Philipp et al. | |
| 2009/0002328 A1 | 1/2009 | Ullrich et al. | |
| 2009/0160682 A1 * | 6/2009 | Bolender et al. | 341/33 |
| 2009/0160763 A1 | 6/2009 | Cauwels et al. | |
| 2009/0167704 A1 | 7/2009 | Terlizzi et al. | |
| 2009/0243817 A1 * | 10/2009 | Son | 340/407.2 |
| 2009/0244017 A1 | 10/2009 | Pala et al. | |
| 2009/0267892 A1 * | 10/2009 | Faubert | 345/156 |
| 2010/0018889 A1 | 1/2010 | Korpanty et al. | |
| 2010/0020039 A1 * | 1/2010 | Ricks et al. | 345/173 |
| 2010/0024573 A1 | 2/2010 | Daverman et al. | |
| 2010/0026664 A1 * | 2/2010 | Geaghan | 345/174 |
| 2010/0033354 A1 * | 2/2010 | Ejlersen | 341/33 |
| 2010/0079384 A1 * | 4/2010 | Grivna | 345/173 |
| 2010/0090813 A1 | 4/2010 | Je et al. | |
| 2010/0107770 A1 * | 5/2010 | Serban et al. | 73/718 |
| 2010/0108409 A1 * | 5/2010 | Tanaka et al. | 178/18.06 |
| 2010/0149128 A1 | 6/2010 | No et al. | |
| 2010/0156814 A1 | 6/2010 | Weber et al. | |
| 2010/0244628 A1 | 9/2010 | Nishigaki et al. | |
| 2010/0250071 A1 | 9/2010 | Pala et al. | |
| 2011/0005845 A1 | 1/2011 | Hotelling et al. | |
| 2011/0025631 A1 | 2/2011 | Han | |
| 2011/0148811 A1 | 6/2011 | Kanehira et al. | |
| 2011/0148812 A1 | 6/2011 | Hente | |
| 2011/0175844 A1 | 7/2011 | Berggren | |
| 2011/0278078 A1 | 11/2011 | Schediwy et al. | |
| 2012/0075243 A1 | 3/2012 | Doi et al. | |
| 2012/0090902 A1 | 4/2012 | Liu et al. | |
| 2012/0098783 A1 | 4/2012 | Badaye et al. | |
| 2012/0105333 A1 | 5/2012 | Maschmeyer et al. | |
| 2012/0242610 A1 | 9/2012 | Yasumatsu | |

FOREIGN PATENT DOCUMENTS

| | | |
|---|---|---|
| WO | 9718528 | 5/1997 |
| WO | 2005121729 A1 | 12/2005 |
| WO | 2007098171 A3 | 8/2007 |
| WO | 2009157614 A1 | 12/2009 |
| WO | 2010018889 A1 | 2/2010 |

OTHER PUBLICATIONS

United States Patent and Trademark Office, US Non-final Office Action for U.S. Appl. No. 12/418,433, dated Jan. 7, 2013.
Korean Intellectual Property Office, International Searching Authority, "International Search Report" mailed Feb. 8, 2012; International Appln. No. PCT/US2011/034261, filed Apr. 28, 2011.
USPTO "Non-Final Office Action" mailed Feb. 3, 2012; U.S. Appl. No. 12/418,433, filed Apr. 3, 2009.
USPTO, Non-Final Office Action in U.S. Appl. No. 13/238,783, mailed Apr. 23, 2014.
USPTO, Final Office Action for U.S. Appl. No. 13/316,279, mailed Aug. 14, 2014.
USPTO, Final Office Action for U.S. Appl. No. 12/418,433, mailed Sep. 29, 2014.
USPTO, Office Action for U.S. Appl. No. 13/094,658, mailed Oct. 9, 2014.
USPTO, Final Office Action for U.S. Appl. No. 13/238,783, mailed Nov. 6, 2014.
International Bureau, International Search Report and Written Opinion for International Application No. PCT/US2012/034540 dated Nov. 30, 2012.
USPTO "Final Office Action" mailed Aug. 2, 2012 for U.S. Appl. No. 12/418,433, filed Apr. 3, 2009.
International Bureau, Preliminary Report on Patentability for International Application No. PCT/US2011/034261 dated Nov. 22, 2012.
USPTO, Non-Final Office Action for U.S. Appl. No. 13/238,783, mailed Oct. 28, 2013.
USPTO, Response to Non-Final Office Action for U.S. Appl. No. 13/238,783, mailed Jan. 20, 2014.
USPTO, Non-Final Office Action for U.S. Appl. No. 12/418,433, mailed Mar. 20, 2014.
USPTO, Non-Final Office Action for U.S. Appl. No. 13/316,279, mailed Mar. 28, 2014.
The International Bureau of WIPO, International Preliminary Report on Patentability for International Application No. PCT/US2012/052909, mailed Apr. 3, 2014.
USPTO, Final Office Action in U.S. Appl. No. 12/418,433, mailed Jul. 19, 2013.
International Search Report PCT/US2010/029823 dated Nov. 19, 2010.
International Bureau, International Search Report and Written Opinion for International Application No. PCT/US2012/060500 dated Jan. 2, 2013.

* cited by examiner

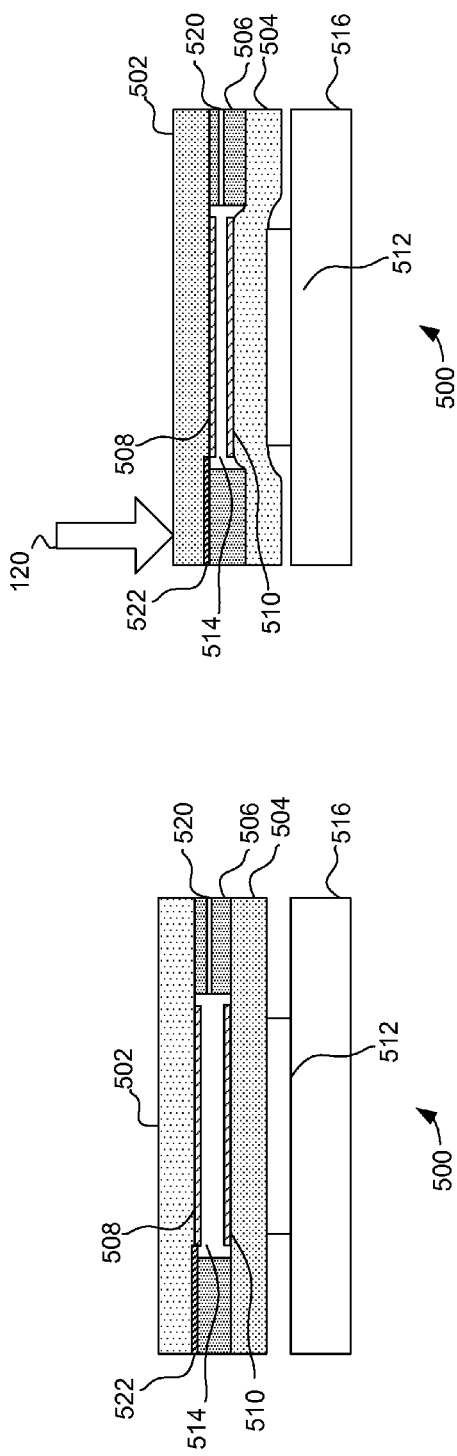
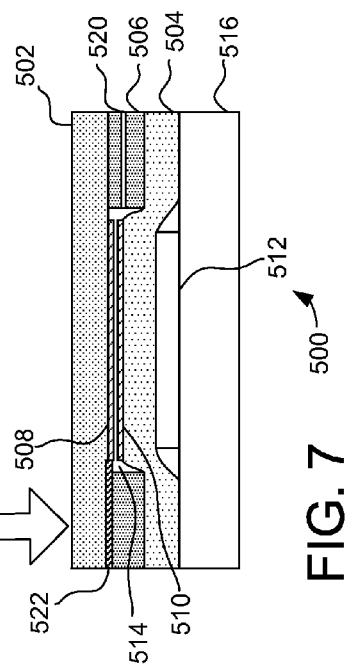
FIG. 5
FIG. 6
FIG. 7

INPUT DEVICE WITH FORCE SENSING

FIELD OF THE INVENTION

This invention generally relates to electronic devices, and more specifically relates to input devices, such as proximity sensor devices and force sensor devices.

BACKGROUND OF THE INVENTION

Proximity sensor devices (also commonly called touch sensor devices) are widely used in a variety of electronic systems. A proximity sensor device typically includes a sensing region, often demarked by a surface, in which input objects can be detected. Example input objects include fingers, styli, and the like. The proximity sensor device can utilize one or more sensors based on capacitive, resistive, inductive, optical, acoustic and/or other technology. Further, the proximity sensor device may determine the presence, location and/or motion of a single input object in the sensing region, or of multiple input objects simultaneously in the sensor region.

The proximity sensor device can be used to enable control of an associated electronic system. For example, proximity sensor devices are often used as input devices for larger computing systems, including: notebook computers and desktop computers. Proximity sensor devices are also often used in smaller systems, including: handheld systems such as personal digital assistants (PDAs), remote controls, and communication systems such as wireless telephones and text messaging systems. Increasingly, proximity sensor devices are used in media systems, such as CD, DVD, MP3, video or other media recorders or players. The proximity sensor device can be integral or peripheral to the computing system with which it interacts.

In the past, some proximity sensors have been implemented with additional ability to detect and determine force applied to a surface of the sensor. For example, by making an estimation of applied force by measuring the increased capacitance that is the result of the increased contact area when a finger is pressed against the surface. Unfortunately, some implementations of these proximity sensors have had limited accuracy when estimating applied force using these techniques. Because of questionable accuracy, such sensors have typically had limited ability to use such determined force as a basis for determining user input. This limits the flexibility of the proximity sensor device to function as an input device. Thus, there exists a need for improvements in proximity sensor device, and in particular, the ability of proximity sensor devices to determine and respond to indications of applied force.

Other desirable features and characteristics will become apparent from the subsequent detailed description and the appended claims, taken in conjunction with the accompanying drawings and the foregoing technical field and background.

BRIEF SUMMARY OF THE INVENTION

Devices and methods are provided that facilitate improved input device performance. The devices and methods utilize a first electrode disposed on a first substrate and a second electrode disposed on a second substrate, where the first electrode and the second electrode define at least part of a variable capacitance. A third substrate is arranged between the first substrate and the second substrate, the third substrate providing a spacer layer between the first and second substrates. The third substrate has an opening arranged such that at least a portion of the first electrode and the second electrode overlap the opening. A transmission element is provided that is physically coupled to the second electrode such that a force biasing the transmission element causes the second electrode to deflect relative to the first electrode, thus changing the variable capacitance. A measurement of the variable capacitance can be used to determine force information regarding the force biasing the transmission element.

In one specific embodiment, the input device and method are implemented with capacitive sensor electrodes. In such an embodiment, the capacitive sensor electrodes may be configured to determine positional information for objects that are in a sensing region. In various implementations, the capacitive sensor electrodes may be implemented on the first substrate, second substrate and/or third substrate. These implementations offer potential advantages of sharing components between the proximity sensor and the force sensor. Stated another way, these implementations allow force sensing to be added to a proximity sensor with relatively low additional cost and complexity.

Thus, the various embodiments provide improved input device performance by facilitating the determination of force information for one or more input objects.

BRIEF DESCRIPTION OF DRAWINGS

The preferred exemplary embodiment of the present invention will hereinafter be described in conjunction with the appended drawings, where like designations denote like elements, and:

FIGS. 3-11 are cross-sectional side view of force sensors in accordance with embodiments of the invention;

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 2:
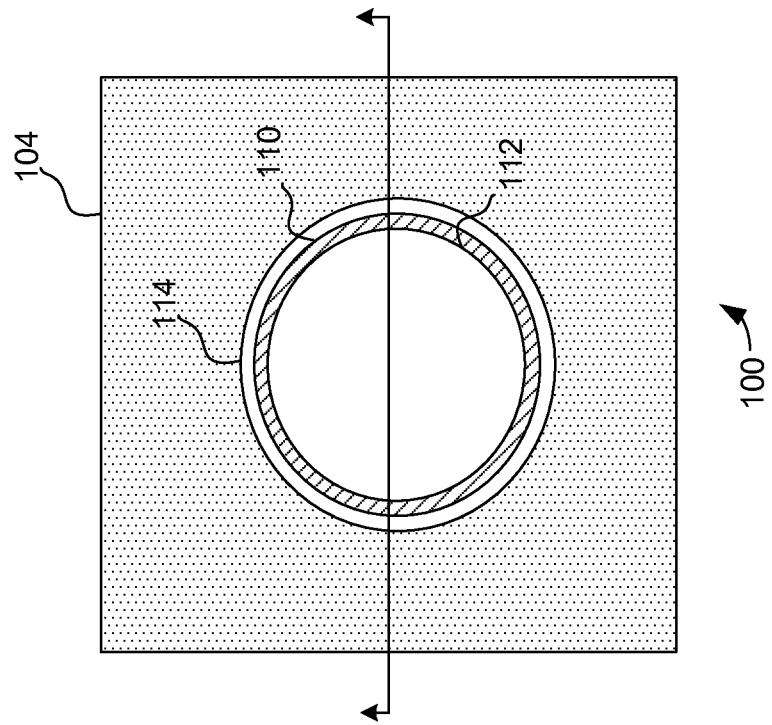
FIG. 2 is a top view of a force sensor in accordance with an embodiment of the invention.
Figure 1:
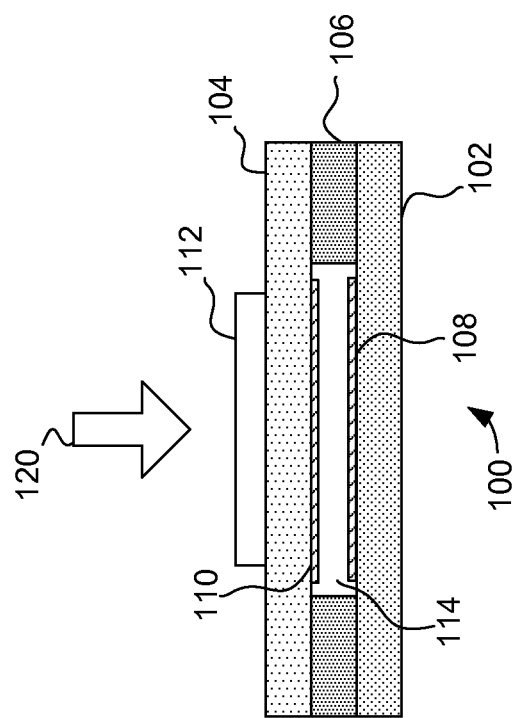
FIG. 1 is a cross-sectional side view of a force sensor in accordance with an embodiment of the invention.

Devices and methods are provided that facilitate improved input device performance. Specifically, the devices and methods provide an input device with force sensing in a cost effective and efficient manner. Turning now to FIGS. 1, and 2, a cross-sectional and partial top view of an input device 100 is illustrated. The input device 100 includes a first substrate 102, a second substrate 104, a third substrate 106, a first electrode 108, a second electrode 110, and a transmission element 112. The third substrate 106 includes an opening 114 that is positioned between first substrate 102 and the second substrate 104. The opening 114 is arranged such that at least a portion of the first electrode 108 and the second electrode 110 overlap the opening 114. The transmission element 112 is dimensioned to fit within the perimeter of the opening 114. In one embodiment, the transmission element may be relatively rigid compared the second substrate 104.

The first electrode 108 and the second electrode 110 define at least part of a variable capacitance. Measurements of this variable capacitance may be determined and used to determine force information regarding a force that is biasing the transmission element 112. Specifically, the transmission element 112 is physically coupled to the second substrate 104 and the second electrode 110. As such, when an input object (such as a finger) applies force (represented by arrow 120), the transmission element 112 causes the second electrode to bias relative to the first electrode, thus changing the variable capacitance. A measurement of the change variable capacitance can be used to determine force information regarding the force biasing the transmission element 112.

Figure 4:
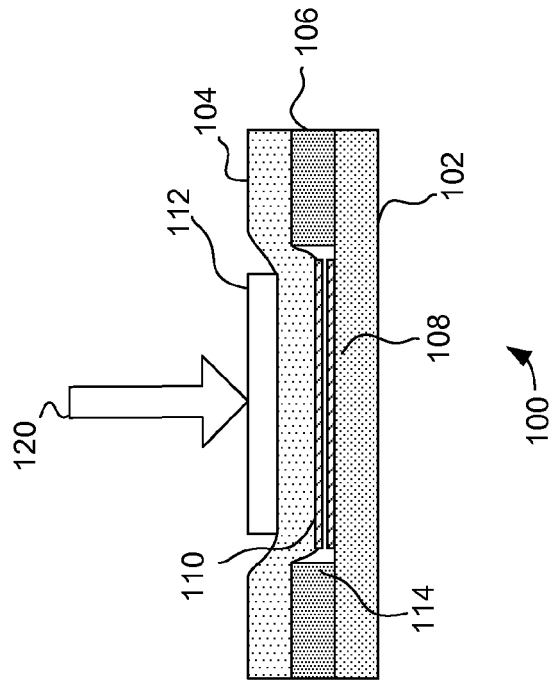
Figure 3:
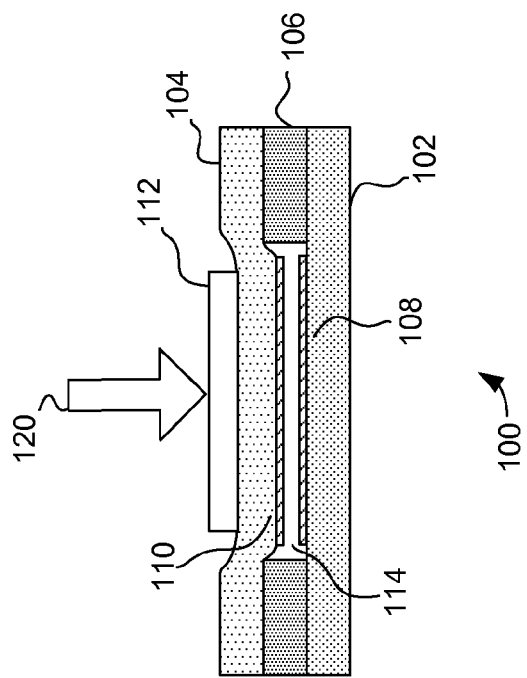

An example of such force biasing is illustrated in FIGS. 3 and 4. As shown in these figures, an increase in the force biasing the transmission element 112 (as represented by a longer arrow 120) causes the second substrate 104 to deform, allowing the second electrode 110 to move relative to the first electrode 108. As the distance between the first electrode 108 and the second electrode 110 changes, the variable capacitance defined in part by electrodes 108 and 110 changes. A measurement of the variable capacitance between electrodes can thus be used to determine force information for the object providing the biasing force.

In some implementations, such an input device 100 can have a relatively linear response to force. That is, as force is applied and biases the transmission element 112, the resulting change in capacitance is a function of the amount of relative movement between the first electrode 108 and the second electrode 110. Likewise, the amount of bias is a function of the force applied to the transmission element 112. With the appropriate selection of materials and geometries, these functions can effectively cancel out nonlinearities, thus resulting in a largely linear response between a measured change in capacitance and the force applied. Thus implemented, the force sensor 100 may provide an accurate and useful measure of applied force.

In a typical implementation, a touch layer, and in some cases other additional layers would cover the transmission element 112. In these embodiments, an input object such as a finger applies force through these additional layers, but otherwise applies force "directly" to the transmission element 112. The transmission element 112 "transmits" that force to the second substrate 104 and the second electrode 110, causing the second electrode 110 to move relative to first electrode 108.

It should be noted that the example implementation shown in FIGS. 1-4 is merely one type of configuration that can be used. For example, the input device 100 shows an implementation where the transmission element 112 is on the side of the input device 100 near where force is applied by a user. That is, the transmission element 112 is located between one or more of the electrodes and where a finger or other input object would apply force. In other embodiments, the transmission element is positioned such that force from an input object is "indirectly" applied to the transmission element. Turning to FIGS. 5, 6 and 7, such an embodiment of an input device 500 is illustrated. The input device 500 includes a first substrate 502, a second substrate 504, a third substrate 506, a first electrode 508, a second electrode 510, a transmission element 512, and a base substrate 516. Again, the third substrate includes an opening 514 that is positioned between first substrate 502 and the second substrate 504. The opening 514 is arranged such that at least a portion of the first electrode 508 and the second electrode 510 overlap the opening 514. The transmission element 512 is dimensioned to fit within the perimeter of the opening 514 and may also be relatively rigid compared the second substrate 504.

In this embodiment, when an input object applies force to the input device 500, that force is "indirectly" applied to the transmission element 512. Specifically, the biasing force pushes the input device 500 against the base substrate 516, and thus indirectly applies force to the transmission element 512. Examples of such biasing are shown in FIGS. 6 and 7, which specifically illustrate the effects of a biasing force being applied. Specifically, force applied by the input object causes an indirect application of force to the transmission element 512, which in turn causes the second electrode 510 to again move relative to the first electrode 508. This results in a change in the variable capacitance, such that a measurement of the change variable capacitance can be used to determine force information regarding the force applied by the input object.

The device 500 illustrated in FIGS. 5-7 also includes a vent 520. Specifically, in FIGS. 5-7 a vent 520 is formed in the third substrate 506. The vent 520 allows gas to exit and enter the opening 514. Thus, when force is applied and the second electrode 510 moves relative to the first electrode 508, the vent 520 allows gas to leave the opening 514. This prevents excessive pressure from forming inside the opening 514. Although the vent 520 is formed the third substrate 506, this is merely one example of where such a vent could be formed. For example, the vent could be formed in either the first or second substrates.

The device 500 illustrated in FIGS. 5-7 also illustrates an electrical conductor 522. The electrical conductor 522 provides electrical connection to the first electrode 508, and is an example of a type of electrical connection which may be provided to the electrodes. The electrical conductor 522 may be formed with any suitable conductive material, and may be formed using any suitable technique. Additionally, while the electrical conductor 522 is illustrated as being formed on the first substrate 502, it may instead be formed with any suitable structure. For example, it may be formed on the second or third substrate, or may be formed with discrete wiring. And again, this is just one example of the type of conductors that may be formed. For example, a typical implementation would have conductors to each electrode in the force sensor, and as well as conductors to other electrodes and circuit elements.

Figure 9:
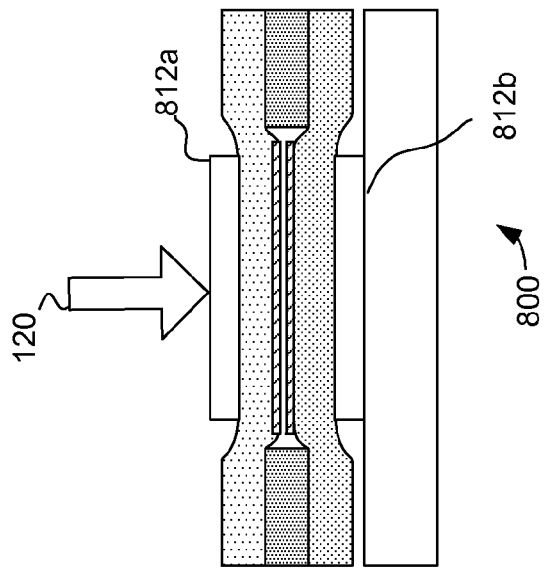
Figure 8:
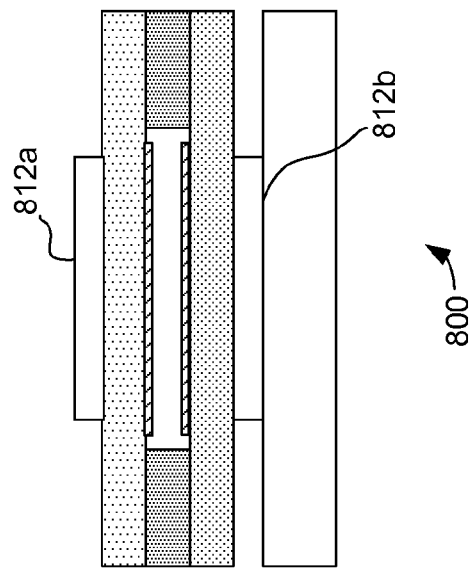

Turning now to FIGS. 8 and 9, an additional variation of an input device 800 is illustrated. Input device 800 is similar to input devices 100 and 500, except that the input device 500 includes two transmission elements 812a and 812b. In this embodiment when input objects such as a finger applies force (represented by arrow 120), that force is directly applied to transmission element 812a and indirectly applied to the transmission element 812b. This causes the distance between electrodes to change, once again resulting in a change in the variable capacitance that can be used to determine force information regarding the force applied by the input object.

Next, it should be noted that the various embodiments can be implemented with a wide variety of different electrode structures and materials. For example, the various embodiments illustrated in FIGS. 1-9 have been shown with electrodes mounted on the "inner sides" of the first and second substrates. Such an embodiment puts the electrodes within, or at least very near to the opening of the third substrate. Additionally, such an embodiment puts the electrodes into relatively close proximity to each other.

Figure 10:
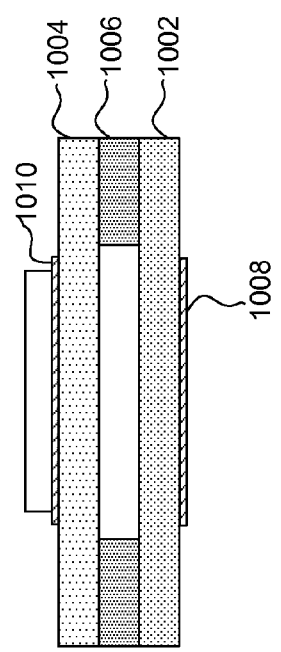

Turning now to FIG. 10, an alternative embodiment of an input device 1000 is illustrated. In this embodiment, the first electrode 1008 is again coupled to the first substrate 1002. Likewise, the second electrode 1010 is coupled to the second substrate 1004. However, in this embodiment both the first electrode 1008 and the second electrode 1010 are on the "outside" of the substrates, away from the opening of in the third substrate 1006. Such an embodiment may be useful for a variety of reasons. For example, it may be useful in those embodiments where it is desirable to increase the separation distance between the first electrode 1008 and the second electrode 1010. It should also be noted in other embodiments, only one of the first electrode 1008 and the second electrode 1010 may be on the outside of its corresponding substrate.

Figure 11:
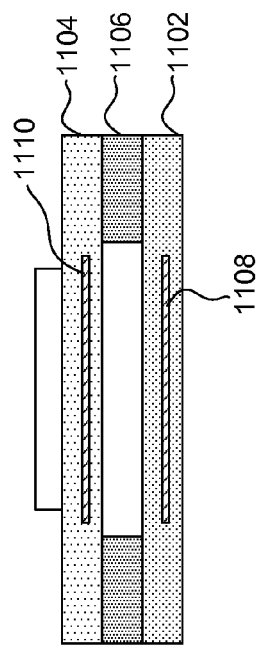

Turning now to FIG. 11, a second alternative embodiment of an input device 1100 is illustrated. Again, this embodiment is like those discussed above, with the main difference being that the first electrode 1108 and the second electrode 1110 are embedded within the substrate rather being formed on, or adjacent to, an associated substrate.

In all of these examples a variety of different materials and techniques can be used to form the forcing sensing electrodes. For example, the first and second electrodes can be formed using a variety of material deposition techniques. As other examples, a conductive material such as metals or conductive oxides may be sputtered or plated on the substrate and then etched to leave behind the desired electrode pattern. In other examples, the electrode material can be printed directly on the substrate by screen printing. In yet another example the electrode material may be embedded directly into the corresponding substrate. Finally, in yet other embodiments, electrode structures may be formed separately and then attached to the appropriate substrate.

As specific examples, the various electrodes may be patterned using a conductive material, such as ITO (indium tin oxide), silver or carbon conductive ink, and copper. Further, any appropriate patterning process may be used in forming the electrode, including sputter deposition, printing, and etching.

A variety of materials may be used to provide the various substrates in the input device. For the illustrated embodiment it will be typically desirable for the second substrate to have considerable elastic properties, thus allowing the second electrode to bias repeatedly relative to the first electrode. As such, common substrate materials such as polyimide (sold under the name Kapton® and others) may be used for such implementations. Polyimide is particularly desirable because it has elastic properties that allow repeated stretching and contracting without suffering permanent damage. Such material may also be desirable in that it may already in use in the device and may thus be available with limited additional costs. An example of this will be discussed in greater detail below.

Other materials that may be used for the various substrates include polyethylene terephthalate (PET), polycarbonate, fiberglass, Poly(methyl methacrylate) and glass. Specifically, PET provides a suitable substrate for both the first and third substrates. PET is desirable in part because openings of various sizes can be easily created. Additionally, PET is transparent and is thus preferred in "touch screen" applications where the touch sensor overlaps at least part of the LCD system.

A variety of materials, shapes and structures may also be used to implement the transmission element. As noted above, the transmission element may provide additional stiffness for the second substrate, thus providing a path for applied force to bias the second electrode relative to the first electrode. Examples of suitable materials for use in the transmission element include a wide range of materials, including relatively rigid materials such as plastics, glass and metals. It should also again be noted that the transmission element is preferably dimensioned such that at least a portion of transmission element overlaps the second electrode and fits within a perimeter of the opening of the third substrate. The use of relatively rigid material and this dimensioning of the transmission element facilitates the flexing of the second substrate in response to force applied to the transmission element. Specifically, dimensioning the transmission element such that at least a portion overlaps the opening to facilitate the biasing of the second substrate into the opening in response to applied force. This biasing of the second substrate causes the second electrode to move relative to the first electrode, thus providing a change in the variable capacitance that may be measured and used to determine force information.

In some implementations it may be desirable to provide a vent for facilitating gas expulsion from the opening when the second electrode is deflected relative to the first electrode. Such a vent may be formed in any suitable location. In the embodiments illustrated in FIGS. 1-18 the vent may be formed in any of the first, second or third substrates. For example, by providing a slit or other via from the opening in the first, second, or third substrate to outside the device. Such a slit or via will allow gas to be expelled from the opening, thus reducing the force needed for the second electrode to deflect relative to the first electrode.

In some implementations it may be desirable to provide additional openings to facilitate consistent biasing of the second electrode biasing relative to the first electrode in response to applied force. For example, small slits may be provided in the first, second, or third substrates to allow the electrodes to bias in a consistent manner in response to force. Such embodiments may be particularly useful in applications where the third substrate does not completely extend around the perimeter of the opening. For example, in embodiments where one side of the third substrate is "missing", a small slit on the opposite side of the third substrate may allow the biasing of electrodes to occur in a more consistent and reliable manner.

Finally, in some embodiments it may be desirable to provide additional layers between the first and second electrodes. For example, to avoid shorting between the first electrode and the second electrode during biasing an insulative layer may be formed there between. When such an insulative layer is sufficiently thin, deflection of the electrode will not be overly hindered and yet shorting between electrodes may be prevented.

The various embodiments illustrated and descried with reference to FIGS. 1-11 are particularly applicable to input devices that combine both proximity sensing and force sensing. In such embodiments, capacitive sensor electrodes may be configured to determine positional information for objects that are in a sensing region. In various implementations, the capacitive sensor electrodes may be implemented on the first substrate, second substrate and/or third substrate. Such implementations offer significant potential advantages in that key components may be shared between the proximity sensor and the force sensor(s). Stated another way, these implementations allow force sensing to be added to a proximity sensor with relatively low additional cost and complexity.

Figure 12:
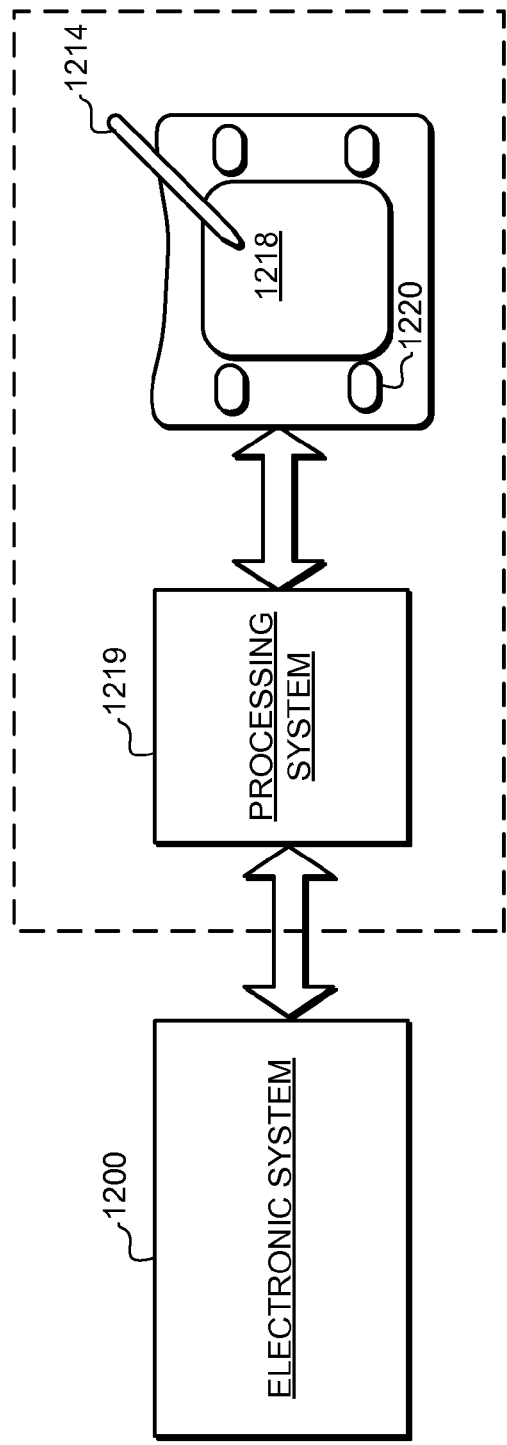
FIG. 12 is a block diagram of a input device in accordance with embodiments of the invention.

Turning now to FIG. 12, a block diagram illustrates an input device 1216 that combines a proximity sensor with a plurality of force sensors. The input device 1216 uses both the proximity sensor and the force sensors to provide an interface for the electronic system 1200. The input device 1216 has a processing system 1219, a sensing region 1218 and four force sensors 1220 implemented proximate the sensing region 1218. As will be described in greater detail below, each of the force sensors 1220 may be implemented with any of the various embodiments of force sensing input devices described above and below. Not shown in FIG. 12 is an array of sensing electrodes that are adapted to capacitively sense objects in the sensing region 1218.

The input device 1216 is adapted to provide user interface functionality by facilitating data entry responsive to position of sensed objects and the force applied by such objects. Specifically, the processing system 1219 is configured to determine positional information for objects sensed by a sensor in the sensing region 1218. This positional information can then be used by the system 1200 to provide a wide range of user interface functionality.

Furthermore, the processing system 1219 is configured to determine force information for objects from measures of force determined by the force sensors 1220. This force information can then also be used by the system 1200 to provide a wide range of user interface functionality. For example, by providing different user interface functions in response to different levels of applied force by objects in the sensing region.

The input device 1216 is sensitive to input by one or more input objects (e.g. fingers, styli, etc.), such as the position of an input object 1214 within the sensing region 1218. "Sensing region" as used herein is intended to broadly encompass any space above, around, in and/or near the input device in which sensor(s) of the input device is able to detect user input. In a conventional embodiment, the sensing region of an input device extends from a surface of the sensor of the input device in one or more directions into space until signal-to-noise ratios prevent sufficiently accurate object detection. The distance to which this sensing region extends in a particular direction may be on the order of less than a millimeter, millimeters, centimeters, or more, and may vary significantly with the type of sensing technology used and the accuracy desired. Thus, embodiments may require contact with the surface, either with or without applied pressure, while others do not. Accordingly, the sizes, shapes, and locations of particular sensing regions may vary widely from embodiment to embodiment.

Sensing regions with rectangular two-dimensional projected shape are common, and many other shapes are possible. For example, depending on the design of the sensor array and surrounding circuitry, shielding from any input objects, and the like, sensing regions may be made to have two-dimensional projections of other shapes. Similar approaches may be used to define the three-dimensional shape of the sensing region. For example, any combination of sensor design, shielding, signal manipulation, and the like may effectively define a sensing region 1218 that extends some distance into or out of the page in FIG. 12.

In operation, the input device 1216 suitably detects one or more input objects (e.g. the input object 1214) within the sensing region 1218. The input device 1216 thus includes a sensor (not shown) that utilizes any combination sensor components and sensing technologies to implement one or more sensing regions (e.g. sensing region 1218) and detect user input such as presences of object(s). Input devices may include any number of structures, such as one or more capacitive sensor electrodes and routing traces adapted to detect object presence.

For example, sensor(s) of the input device 1216 may use arrays or other patterns of capacitive sensor electrodes to support any number of sensing regions 1218. As another example, the sensor may use capacitive sensing technology in combination with resistive sensing technology to support the same sensing region or different sensing regions. Examples of the types of technologies that may be used to implement the various embodiments of the invention may be found in U.S. Pat. Nos. 5,543,591, 5,648,642, 5,815,091, 5,841,078, and 6,249,234.

In some capacitive implementations of input devices, a voltage is applied to create an electric field across a sensing surface. These capacitive input devices detect the position of an object by detecting changes in capacitance caused by the changes in the electric field due to the object. The sensor may detect changes in voltage, current, or the like.

As an example, some capacitive implementations utilize resistive sheets, which may be uniformly resistive. The resistive sheets are electrically (usually ohmically) coupled to electrodes. In some embodiments, these electrodes may be located at corners of the resistive sheet, provide current to the resistive sheet, and detect current drawn away by input devices via capacitive coupling to the resistive sheet. In other embodiments, these electrodes are located at other areas of the resistive sheet, and drive or receive other forms of electrical signals. Depending on the implementation, the sensor electrodes may be considered to be the resistive sheets, the electrodes coupled to the resistive sheets, or the combinations of electrodes and resistive sheets.

As another example, some capacitive implementations utilize transcapacitive sensing methods based on the capacitive coupling between sensor electrodes. Transcapacitive sensing methods are sometimes also referred to as "mutual capacitance sensing methods." In one embodiment, a transcapacitive sensing method operates by detecting the electric field coupling one or more transmitting electrodes with one or more receiving electrodes. Proximate objects may cause changes in the electric field, and produce detectable changes in the transcapacitive coupling. Sensor electrodes may transmit as well as receive, either simultaneously or in a time-multiplexed manner. Sensor electrodes that transmit are sometimes referred to as the "transmitting sensor electrodes," "driving sensor electrodes," "transmitters," or "drivers"—at least for the duration when they are transmitting. Other names may also be used, including contractions or combinations of the earlier names (e.g. "driving electrodes" and "driver electrodes") Sensor electrodes that receive are sometimes referred to as "receiving sensor electrodes," "receiver electrodes," or "receivers"—at least for the duration when they are receiving. Similarly, other names may also be used, including contractions or combinations of the earlier names. In one embodiment, a transmitting sensor electrode is modulated relative to a system ground to facilitate transmission. In another embodiment, a receiving sensor electrode is not modulated relative to system ground to facilitate receipt.

In FIG. 12, the processing system (or "processor") 1219 is coupled to the input device 1216 and the electronic system 1200. Processing systems such as the processing system 1219 may perform a variety of processes on the signals received from the sensor(s) and force sensors of the input device 1216. For example, processing systems may select or couple individual sensor electrodes, detect presence/proximity, calculate position or motion information, or interpret object motion as gestures. Processing systems may also calibrate individual force sensors and determine force measurements from data provided by the force sensors.

The processing system 1219 may provide electrical or electronic indicia based on positional information and force information of input objects (e.g. input object 1214) to the electronic system 1200. In some embodiments, input devices use associated processing systems to provide electronic indicia of positional information and force information to electronic systems, and the electronic systems process the indicia to act on inputs from users. One exemplary system response is moving a cursor or other object on a display, and the indicia may be processed for any other purpose. In such embodiments, a processing system may report positional and force information to the electronic system constantly, when a threshold is reached, in response criterion such as an identified stroke of object motion, or based on any number and variety of criteria. In some other embodiments, processing systems may directly process the indicia to accept inputs from the user and cause changes on displays or some other actions without interacting with any external processors.

In this specification, the term "processing system" is defined to include one or more processing elements that are adapted to perform the recited operations. Thus, a processing system (e.g. the processing system 1219) may comprise all or part of one or more integrated circuits, firmware code, and/or software code that receive electrical signals from the sensor and communicate with its associated electronic system (e.g. the electronic system 1200). In some embodiments, all processing elements that comprise a processing system are located together, in or near an associated input device. In other embodiments, the elements of a processing system may be physically separated, with some elements close to an associated input device and some elements elsewhere (such as near other circuitry for the electronic system). In this latter embodiment, minimal processing may be performed by the processing system elements near the input device, and the majority of the processing may be performed by the elements elsewhere, or vice versa.

Furthermore, a processing system (e.g. the processing system 1219) may be physically separate from the part of the electronic system (e.g. the electronic system 1200) that it communicates with, or the processing system may be implemented integrally with that part of the electronic system. For example, a processing system may reside at least partially on one or more integrated circuits designed to perform other functions for the electronic system aside from implementing the input device.

In some embodiments, the input device is implemented with other input functionality in addition to any sensing regions. For example, the input device 1216 may be implemented with buttons or other input devices near the sensing region. The buttons may be used to facilitate selection of items using the proximity sensor device, to provide redundant functionality to the sensing region, or to provide some other functionality or non-functional aesthetic effect. Buttons form just one example of how additional input functionality may be added to the input device 1216. In other implementations, input devices such as the input device 1216 may include alternate or additional input devices, such as physical or virtual switches, or additional sensing regions. Conversely, in various embodiments, the input device may be implemented with only sensing region input functionality.

Likewise, positional information may be any suitable indicia of object presence. For example, processing systems may be implemented to determine "one-dimensional" positional information as a scalar (e.g. position or motion along a sensing region). Processing systems may also be implemented to determine multi-dimensional positional information as a combination of values (e.g. two-dimensional horizontal/vertical axes, three-dimensional horizontal/vertical/depth axes, angular/radial axes, or any other combination of axes that span multiple dimensions), and the like. Processing systems may also be implemented to determine information about time or history.

Furthermore, the term "positional information" as used herein is intended to broadly encompass absolute and relative position-type information, and also other types of spatial-domain information such as velocity, acceleration, and the like, including measurement of motion in one or more directions. Various forms of positional information may also include time history components, as in the case of gesture recognition and the like. Likewise, the term "force information" as used herein is intended to broadly encompass force information regardless of format. For example, the force information can be provided for each object as a vector or scalar quantity. As another example, the force information can be provided as an indication that determined force has or has not crossed a threshold amount. As other examples, the force information can also include time history components used for gesture recognition. As will be described in greater detail below, positional information and force information from the processing systems may be used to facilitate a full range of interface inputs, including use of the proximity sensor device as a pointing device for selection, cursor control, scrolling, and other functions.

In some embodiments, an input device such as the input device 1216 is adapted as part of a touch screen interface. Specifically, a display screen is overlapped by at least a portion of a sensing region of the input device, such as the sensing region 1218. Together, the input device and the display screen provide a touch screen for interfacing with an associated electronic system. The display screen may be any type of electronic display capable of displaying a visual interface to a user, and may include any type of LED (including organic LED (OLED)), CRT, LCD, plasma, EL or other display technology. When so implemented, the input devices may be used to activate functions on the electronic systems. In some embodiments, touch screen implementations allow users to select functions by placing one or more objects in the sensing region proximate an icon or other user interface element indicative of the functions. The input devices may be used to facilitate other user interface interactions, such as scrolling, panning, menu navigation, cursor control, parameter adjustments, and the like. The input devices and display screens of touch screen implementations may share physical elements extensively. For example, some display and sensing technologies may utilize some of the same electrical components for displaying and sensing.

It should be understood that while many embodiments of the invention are to be described herein the context of a fully functioning apparatus, the mechanisms of the present invention are capable of being distributed as a program product in a variety of forms. For example, parts of the present invention may be implemented and distributed as a sensor program on computer-readable media. Additionally, the embodiments of the present invention apply equally regardless of the particular type of computer-readable medium used to carry out the distribution. Examples of computer-readable media include various discs, memory sticks, memory cards, memory modules, and the like. Computer-readable media may be based on flash, optical, magnetic, holographic, or any other storage technology.

As noted above, the input device 1216 may be implemented with a variety of different types and arrangements of capacitive sensing electrodes. To name several examples, the capacitive sensing device may be implemented with electrode arrays that are formed on multiple substrate layers, including parts of the same layers used to form the force sensors. As one specific embodiment, electrodes for sensing in one direction (e.g., the "X" direction) may formed on a first layer (e.g., the first, second or third substrates of FIGS. 1-18), while the electrodes for sensing in a second direction (e.g., the "Y" direction are formed on a second layer (e.g., another of the first, second or third substrates of FIGS. 1-18).

In other embodiments, the electrodes for both the X and Y sensing may be formed on the same layer, with that same layer comprising any of the substrates described in FIGS. 1-18. In yet other embodiments, the electrodes may be arranged for sensing in only one direction, e.g., in either the X or the Y direction. In still another embodiment, the electrodes may be arranged to provide positional information in polar coordinates, such as "r" and "θ" as one example. In these embodiments the electrodes themselves are commonly arranged in a circle or other looped shape to provide "θ", with the shapes of individual electrodes used to provide "r". Also, a variety of different electrode shapes may be used, including electrodes shaped as thin lines, rectangles, diamonds, wedge, etc. Finally, a variety of conductive materials and fabrication techniques may be used to form the electrodes. As one example, the electrodes are formed by the deposition and etching of copper or ITO on a substrate.

Figure 13:
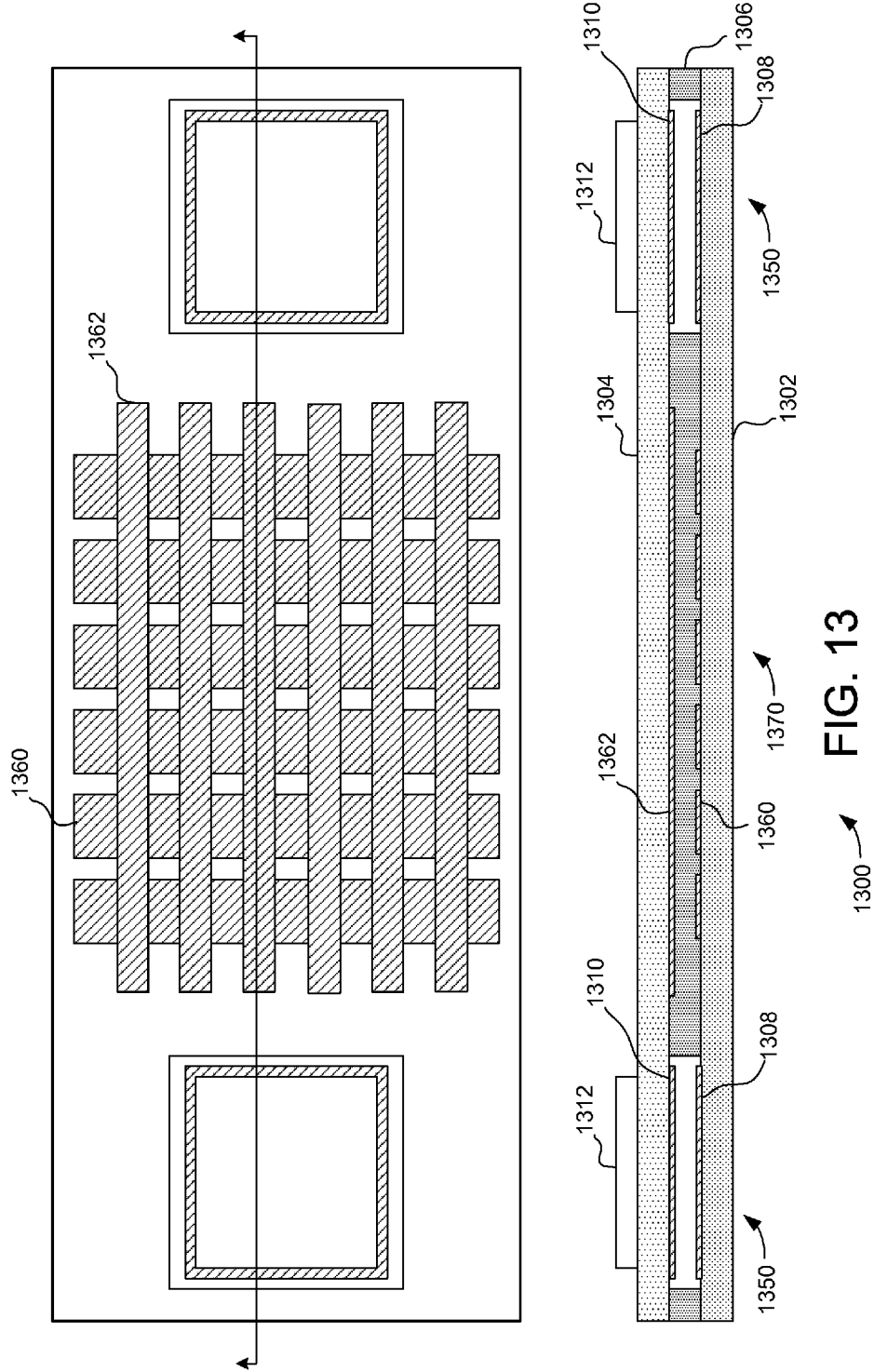
FIGS. 13-18 are side and top views of input devices in accordance with embodiments of the invention.

Turning now to FIG. 13, cross-sectional and top views of input device 1300 are illustrated. The input device 1300 is implemented with two force sensors 1350, one proximate each end, and a proximity sensor 1370 between the force sensors 1350. In this embodiment, the two force sensors 1350 have a substantially square shape compared to the circular shaped force sensors illustrated in FIGS. 1-2. However, these are again just examples of the various shapes that may be used.

The input device 1300 includes a first substrate 1302, a second substrate 1304, and a third substrate 1306 with openings. Each force sensor 1350 includes a first electrode 1308, a second electrode 1310, and a transmission element 1312. As discussed above, the openings in the third substrate 1306 are arranged such that at least a portion of each first electrode 1308 and each second electrode 1310 overlap at one of the openings. The transmission elements 1312 may be relatively rigid compared the second substrate 1304 and are dimensioned to fit within the perimeter of its corresponding opening.

Between the force sensors 1350 is an array of capacitive sensing electrodes. In the illustrated embodiment, the array of capacitive sensor electrodes comprises a first plurality of electrodes 1360 disposed on the first substrate 1302 and a second plurality of electrodes 1362 disposed on the second substrate 1304. As can be clearly seen in the top view, the first plurality of electrodes 1360 and the second plurality of electrodes 1362 are arranged in nearly orthogonal directions. Such an arrangement can useful in both self capacitive and transcapacitive sensing devices and can thus be used to provide multi-object sensing. As such, the electrodes facilitate the capacitive detection of objects in the sensing region and the determination of positional information from that capacitive detection.

Returning to the force sensors, as with the embodiments described above, the first electrode 1308 and the second electrode 1310 define at least part of a variable capacitance. Measurements of this variable capacitance may be determined and used to determine force information regarding a force that is biasing the transmission elements 1312. Specifically, when an input object applies force the transmission elements 1312 cause the second electrode to move relative to the first electrode, thus changing the variable capacitance. A measurement of the change variable capacitance can be used to determine force information at the corresponding force sensors. The force information from the multiple sensors 1350 can be combined to determine force information for objects being used to apply pressure.

It is important to note that in this example the proximity sensor 1370 and the force sensors 1350 share common elements. Specifically, the first substrate 1302, the second substrate 1304, and the third substrate 1306 shared between all devices. Because of this, the marginal cost and added complexity required to add force sensors to a proximity sensor is relatively low. This is particularly true where the various substrate materials and electrodes are already present in the proximity sensor.

As specific examples, the first, second and third substrates 1302, 1304 and 1306 can comprise PET substrates, polyimide layers, and other materials that are commonly used in proximity sensor devices.

It should be noted that while FIG. 13 shows an example where the proximity sensor comprises a first plurality of electrodes 1360 disposed on the first substrate 1302 and a second plurality of electrodes 1362 disposed on the second substrate 1304, that this is just one example implementation. For example, the various capacitive sensing electrodes could instead be disposed on any of the first, second or third substrates 1302, 1304 or 1306, or another substrate entirely.

To give several examples, in some capacitive sensors all the electrodes may be formed in one layer on the device. Such a device could thus be implemented with all the electrodes formed upon either the first, second or third substrates 1302, 1304 or 1306. As another example, in some embodiments the electrodes may be formed on opposite sides of the same substrate. In these embodiments the capacitive sensor electrodes may be formed on both sides of either first, second or third substrates 1302, 1304 or 1306. In any case, it should again be noted that the substrate layers used to provide capacitive sensing may also be used to form the force sensors.

This is especially advantageous where the substrate layers in use have the mechanical properties that lend themselves for use in the force sensor. For example, a typical proximity sensor may use two PET substrates upon which electrodes are disposed and a flexible polyimide layer upon which routing traces are disposed. In such an embodiment, the polyimide layer is particularly suited to being used for the second substrate, as it has good elastic properties that will allow the force sensor electrode to move relative to the other force sensor electrode. The PET layers likewise provide good substrates upon which electrodes may be formed.

In another embodiment calibration sensors may be added to the input device. Specifically, a calibration sensor may be formed by disposing first and second sensor electrodes separated by a distance, using the same structures and techniques as used to construct the force sensors. However, the calibration sensors would typically not include a transmission element, and as such the first and second sensor electrodes will not be biased relative to each other in response to the application of force. Such calibration sensors will still provide a capacitance that can be measured, and that capacitance measure will change in response to temperature variations, source voltage variations, and other abnormalities. Because such measured changes in capacitance would only be in response to such variations, providing such a calibration sensor and measuring the capacitance changes will provide a way to compensate for these variations.

Figure 14:
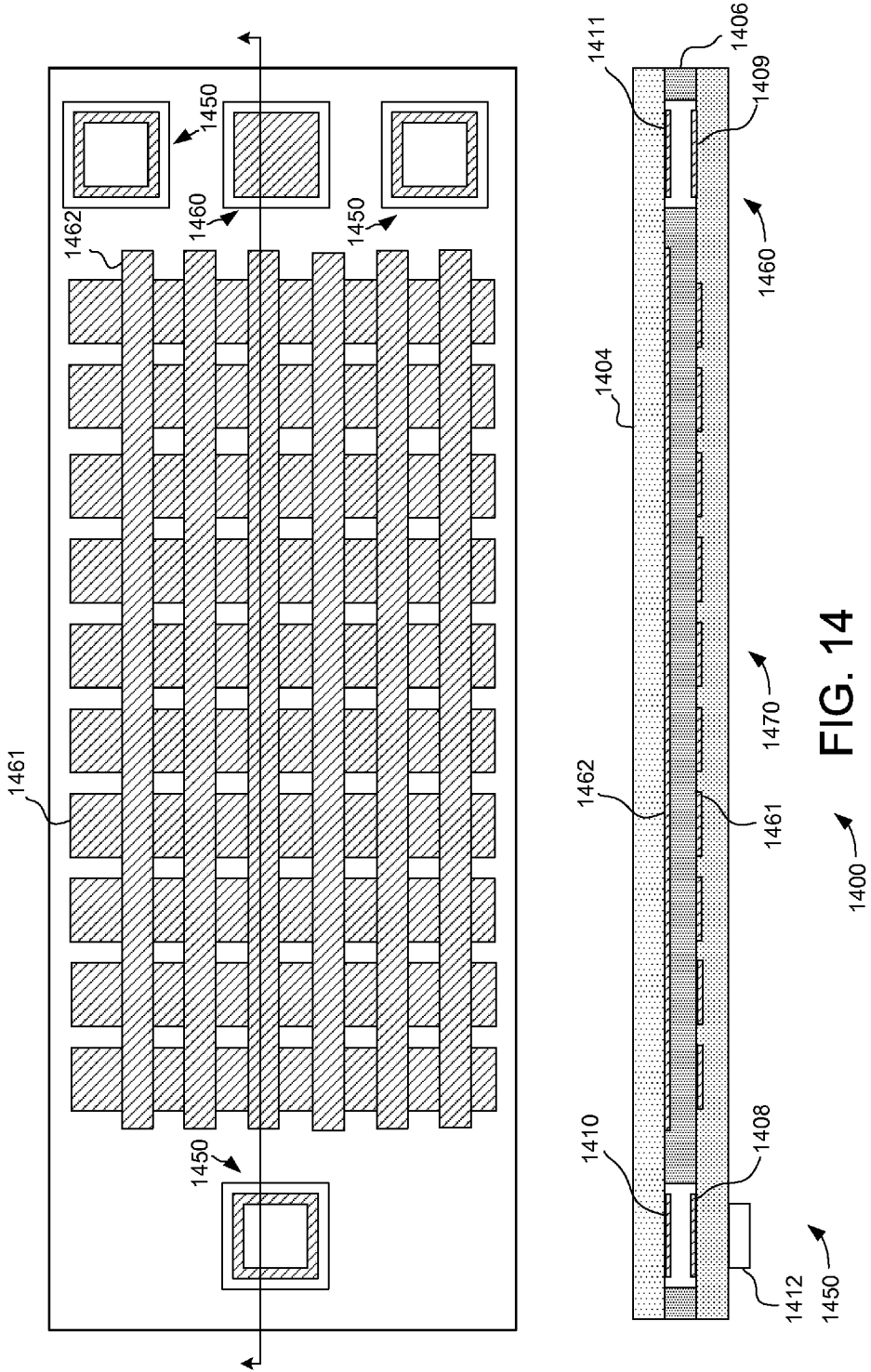

Turning now to FIG. 14, cross-sectional and top views of input device 1400 are illustrated. The input device 1400 is implemented with three force sensors 1450 and one calibration sensor 1460, and a proximity sensor 1470 between the force sensors 1450 and the calibration sensor 1460.

The input device 1400 includes a first substrate 1402, a second substrate 1404, and a third substrate 1406 with an opening. Each force sensor 1450 includes a first electrode 1408, a second electrode 1410, and a transmission element 1412. The calibration sensor 1460 includes a first electrode 1409, a second electrode 1411, but does not include a transmission element. As such, the first electrode 1409 and the second electrode 1411 will not be biased relative to each other in response to the application of force, but will instead be used to provide a capacitance that changes in response to temperature variations, source voltage variations, and other abnormalities.

Between the force sensor 1450 and the calibration sensor 1460 is the proximity sensor 1470, which includes an array of capacitive sensing electrodes. In this illustrated embodiment, the array of capacitive sensor electrodes comprises a first plurality of electrodes 1461 disposed on the third substrate 1406 and a second plurality of electrodes 1462 disposed on the second substrate 1404.

In this example the proximity sensor 1470, the force sensor 1450 and the calibration sensor 1460 again share common elements. Specifically, the first substrate 1402, the second substrate 1404, and the third substrate 1406 are shared between all devices. Because of this, the marginal cost and complexity required to add force sensors to a proximity sensor may be relatively low. This is particularly true where the various substrate materials (e.g., substrates 1402, 1404 and 1406) are already present in the proximity sensor, and where the force sensor electrodes (e.g., electrodes 1408 and 1410) may be formed in the same process steps used to form corresponding items in the proximity sensor.

Figure 15:
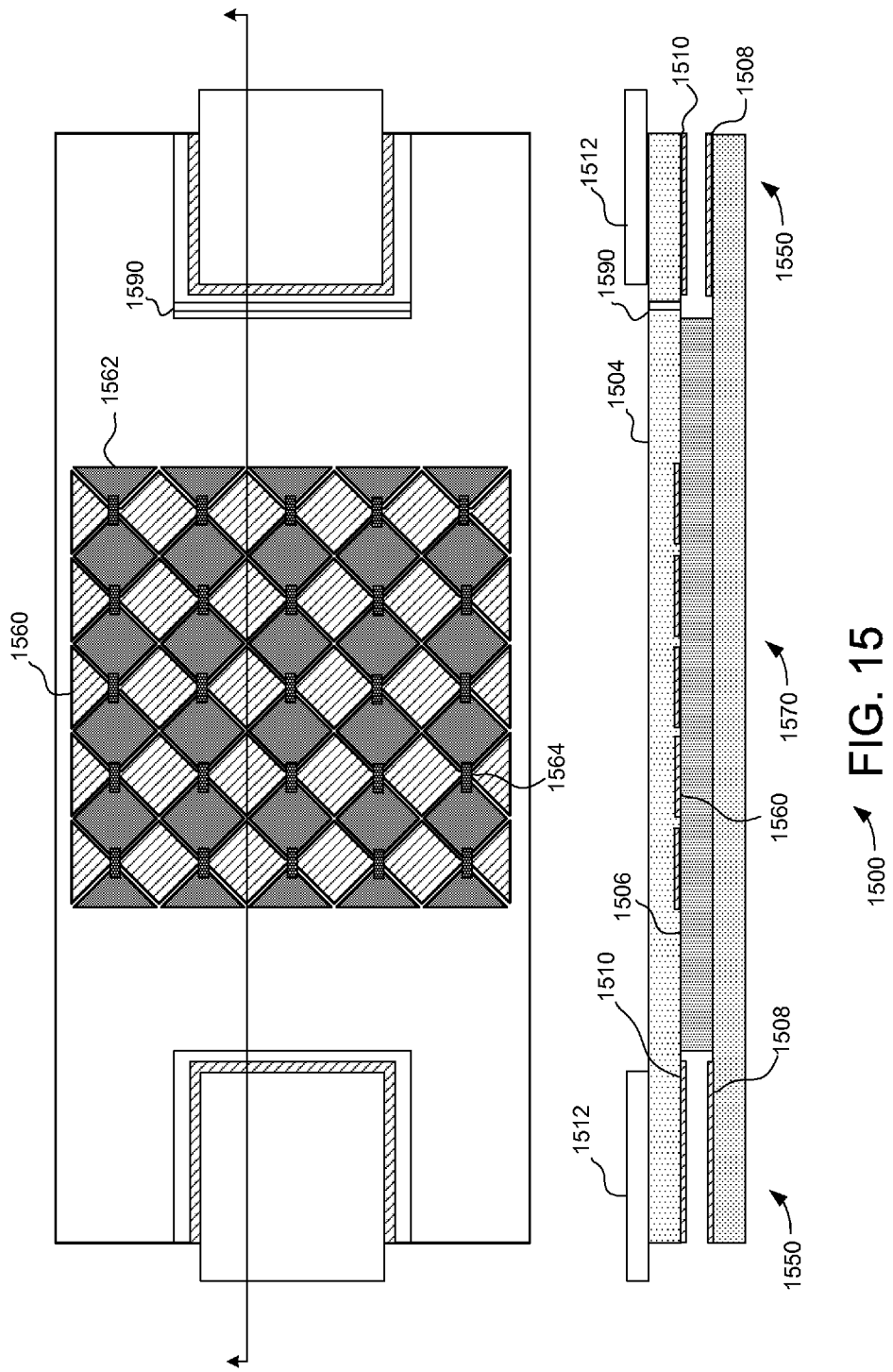

Turning now to FIG. 15, cross-sectional and top views of an input device 1500 are illustrated. The input device 1500 is implemented with two force sensors 1550 and a proximity sensor 1570 between the force sensors 1550.

The input device 1500 includes a first substrate 1502, a second substrate 1504, and a third substrate 1506. The force sensors 1550 each include a first electrode 1508, a second electrode 1510, and a transmission element 1512. Again, between the force sensors 1550 is an array of capacitive sensing electrodes. It should be noted that the locations of the force sensors 1550 relative to the capacitive sensing electrodes is purely for illustrative purposes and should not be limited as described. In this illustrated embodiment, the array of capacitive sensor electrodes comprises a first plurality of electrodes 1560 and a second plurality of electrodes 1562, both of which are disposed on the third substrate 1506. Specifically, the first plurality of electrodes 1560 comprises a row of interconnected diamond shaped electrodes arranged in a first direction. Likewise, the second plurality of electrodes 1562 comprises rows of diamond shaped electrodes connected by jumpers 1564 and arranged in a second direction perpendicular to the first direction. Again, the electrodes 1560 and 1562 facilitate the capacitive detection of objects in the sensing region and the determination of positional information from that capacitive detection.

In this embodiment, the transmission elements 1512 extend beyond the sides of the first substrate 1502 and the second substrate 1504. This is an example of an embodiment where a portion (e.g., one or more sides of the perimeter) of the third substrate 1506 is "missing", but where the remaining portions of the third substrate 1506 still define an opening. It also should be noted that because the opening extends to the edge of the third substrate 1506, there is in effect a missing side of the opening. This is an example of an embodiment where transmission elements 1512 may fit within the opening even though the actual area of the transmission elements 1512 could be considered to be larger than the opening area. It should be further understood that while in some embodiments it may not be desired or practical to fit the transmission element completely within an opening, in which case the transmission element may have a portion outside the opening. Such embodiments will be described in greater detail below.

Also, as was described above, in this embodiment it may be desirable to include slits, perforations and other openings in the substrates to allow biasing of electrodes to occur in a more consistent and reliable manner. For example, FIG. 15 illustrates a slit 1590 formed in the second substrate 1504, proximate to an edge of the opening in the third substrate 1506. Such a slit 1590 may be added to facilitate the biasing of the second electrode 1510 relative to the first electrode 1508, and thus may be desirable in some embodiments. Such a slit 1590 may also be used as a vent described above.

Figure 16:
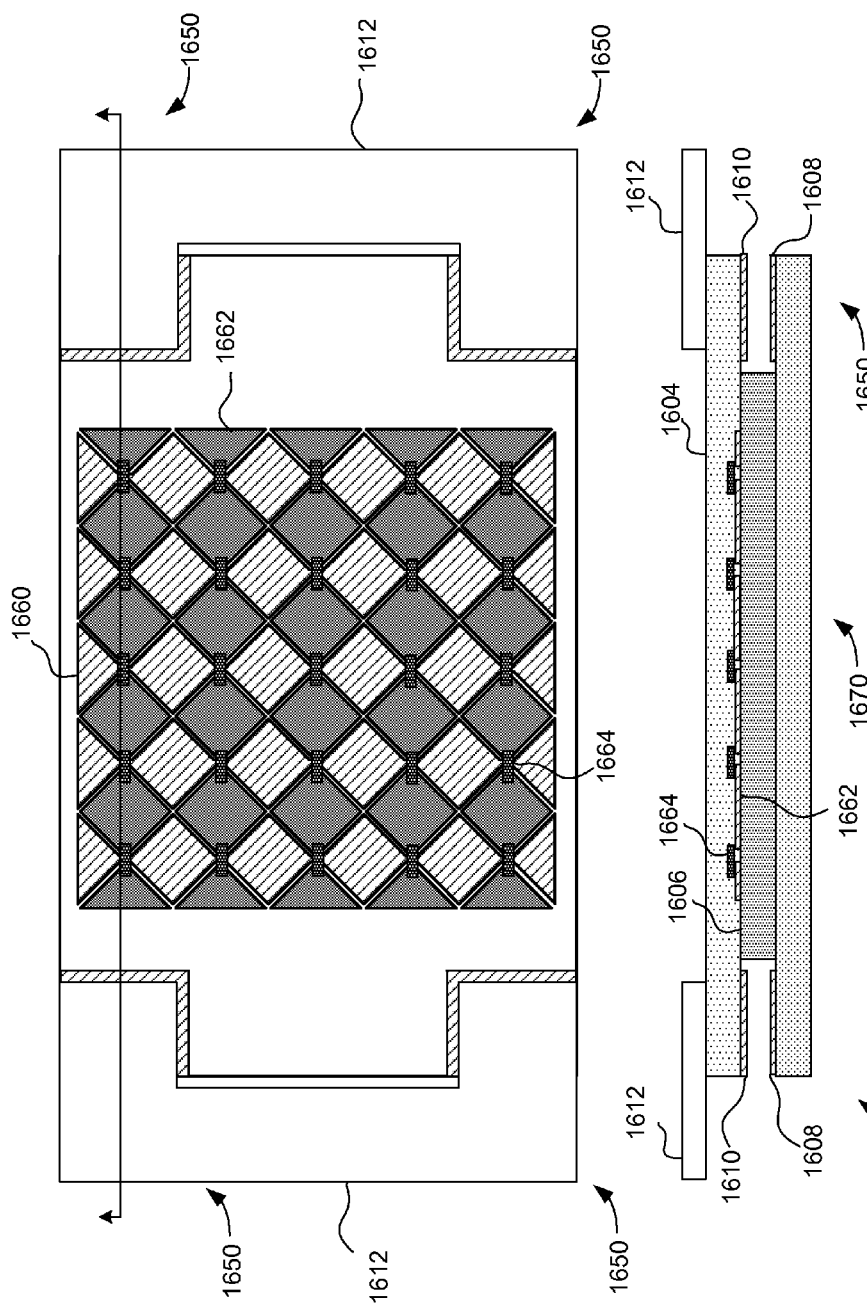

Turning now to FIG. 16, cross-sectional and top views of an input device 1600 are illustrated. The input device 1600 is again implemented with four force sensors 1650 and a proximity sensor 1670 between the force sensors 1650.

The input device 1600 includes a first substrate 1602, a second substrate 1604, and a third substrate 1606. The force sensors 1650 each include a first electrode 1608, a second electrode 1610, and a transmission element 1612. Again, between the force sensors 1650 is an array of capacitive sensing electrodes. In this embodiment, the array of capacitive sensor electrodes comprises a first plurality of electrodes 1660 and a second plurality of electrodes 1662, both of which are again disposed on the third substrate 1606. And again, the electrodes 1660 and 1662 facilitate the capacitive detection of objects in the sensing region and the determination of positional information from that capacitive detection.

In this embodiment, the force sensors 1650 are arranged with two sensors on each side of the proximity sensor 1670. Furthermore, the transmission element 1612 for each pair of force sensors 1650 is made from one contiguous piece of material. Furthermore, like those illustrated in FIG. 15, the transmission elements 1612 are larger than the openings, and in this case extend beyond both the opening and the second substrate. Finally, the shape of the transmission elements 1612 are such that they are dimensioned to fit within the opening even though the actual area of the transmission elements 1612 could be considered to be larger than the opening area.

Figure 17:
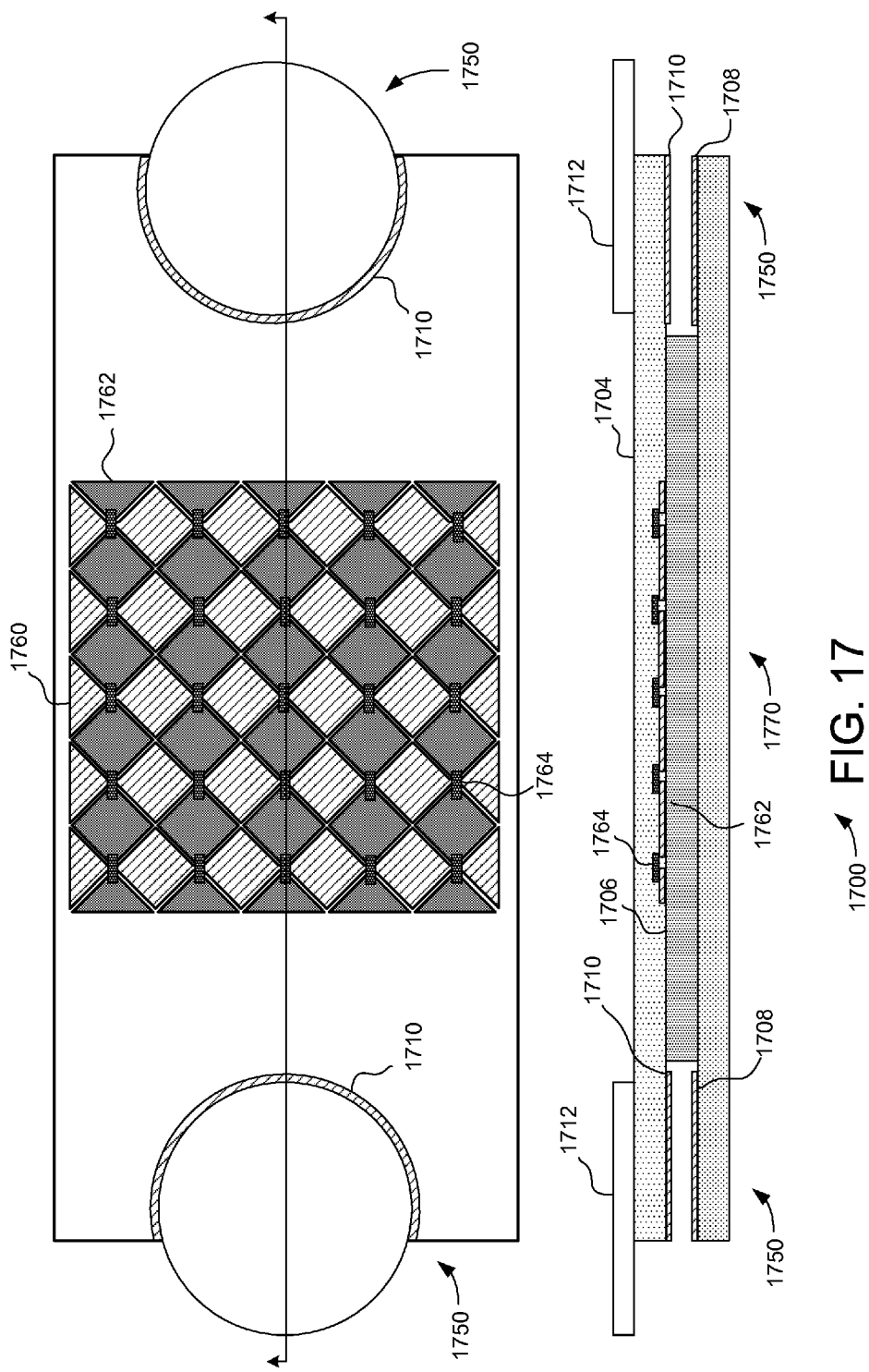

Turning now to FIG. 17, cross-sectional and top views of an input device 1700 are illustrated. The input device 1700 is implemented with two force sensors 1750 and a proximity sensor 1770 between the force sensors 1750. The input device 1700 includes a first substrate 1702, a second substrate 1704, and a third substrate 1706. The force sensors 1750 each include a first electrode 1708, a second electrode 1710, and a transmission element 1712. Again, between the force sensors 1750 is an array of capacitive sensing electrodes. In this illustrated embodiment, the array of capacitive sensor electrodes comprises a first plurality of electrodes 1760 and a second plurality of electrodes 1762, both of which are again disposed on the third substrate 1706. And again, the electrodes 1760 and 1762 facilitate the capacitive detection of objects in the sensing region and the determination of positional information from that capacitive detection.

In this embodiment, the force sensors 1750 have a semi-circular shape. Specifically, the electrodes 1708 and 1710 are both semi-circular, while the transmission elements 1712 are circular. Again, this is just one example of how the various elements may be shaped.

Figure 18:
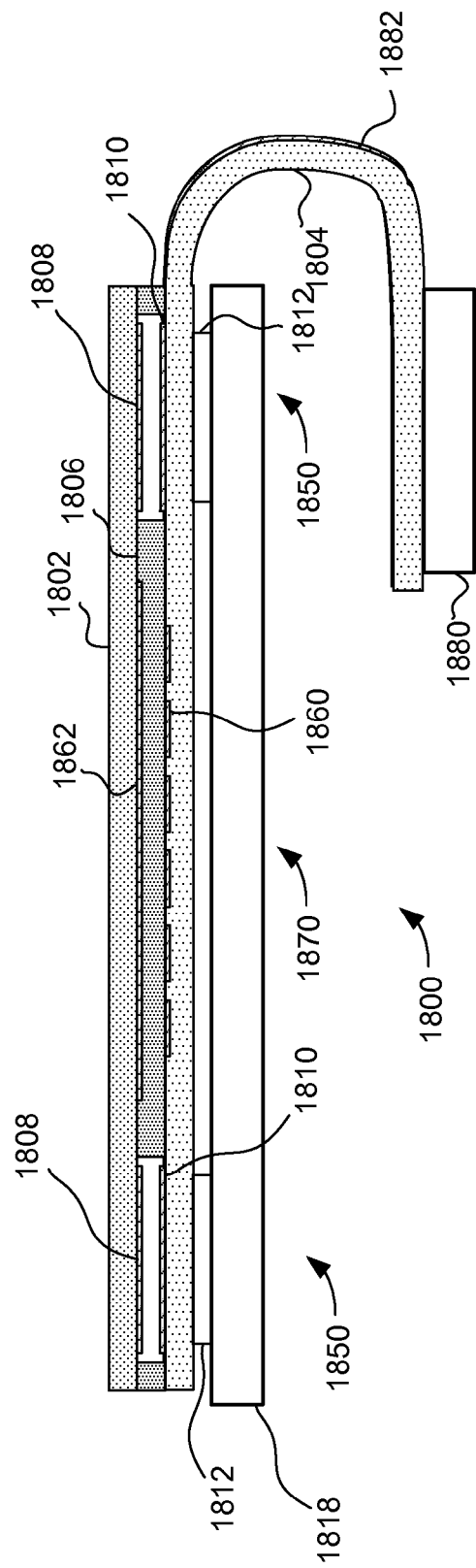

Turning now to FIG. 18, a cross-sectional view of an input device 1800 is illustrated. Like the some of the previous embodiments, the input device 1800 is implemented with two force sensors 1850 and a proximity sensor 1870 between the force sensors 1850. The input device 1800 includes a first substrate 1802, a second substrate 1804, and a third substrate

1806. The force sensors 1850 each include a first electrode 1808, a second electrode 1810, and a transmission element 1812. Again, between the force sensors 1850 is an array of capacitive sensing electrodes. In this illustrated embodiment, the array of capacitive sensor electrodes comprises a first plurality of electrodes 1860 disposed on the third substrate 1806 and a second plurality of electrodes 1862 disposed on the first substrate 1802. Again, the electrodes 1860 and 1862 facilitate the capacitive detection of objects in the sensing region and the determination of positional information from that capacitive detection.

Also, it should be noted that like the embodiment illustrated in FIGS. 5-7, this embodiment is implemented such that force from an input object is "indirectly" applied to the transmission elements 1812. Specifically, the biasing force pushes the input device 1800 against the base substrate 1818, and thus indirectly applies force to the transmission elements 1812. Specifically, force applied by the finger or other object causes an indirect application of force to the transmission element 1812, which in turn cause the second electrodes 1810 to again move relative to the first electrodes 1808. This results in a change in the variable capacitance, such that a measurement of the change variable capacitance can be used to determine force information regarding the force applied by the input object.

Also, in this embodiment the elements are further shared in that the second substrate 1804 comprises a flexible substrate which may be used to mount a processor 1880 and communicatively couple the processor 1880 to the input device 1800 with at least one routing trace 1882. For example, the input device 1800 may be implemented with two PET substrates used to implement the first substrate 1802 and the third substrate 1806, and with a polyimide or other flexible substrate layer used to implement the second substrate 1804. This flexible substrate layer is used to mount the processor 1880, and also includes the routing traces 1882 which are used to couple to the processor 1880. It should be noted that in this specific embodiment, the same process used to form the routing traces 1882 may be used to form the second electrodes 1810. Additionally, the same physical properties that allow a flexible substrate such as polyimide to "flex" and yet provide secure mounting for the processor 1880 provide the ability of the second electrodes 1810 to repeatedly bias toward the first electrode 1808 without structure failure. Thus, such a device may be reliably and inexpensively provided with relatively low additional cost and complexity when compared to proximity sensors that do not include such force sensors.

It should be noted that device elements illustrated in the FIGS described above are not necessarily drawn to scale. Furthermore, it should be noted that the various illustrations are simplified representations of what a typical device would include. For example, various illustrations show electrodes intruding into or on top of various substrates. It should be understood that such illustrations are used to illustrate what substrate various electrodes are deposited onto. It is understood by one skilled in the art that such electrodes do not prevent various substrates from contacting uniformly nor do the illustrations imply that various electrodes somehow intrude upon a substrate which may be contacting the electrodes . . . .

The various devices and methods thus facilitate improved input device performance. The devices and methods utilize a first electrode disposed on a first substrate and a second electrode disposed on a second substrate, where the first electrode and the second electrode define at least part of a variable capacitance. A third substrate is arranged between the first substrate and the second substrate, the third substrate providing a spacer layer between the first and second substrates. The third substrate has an opening arranged such that at least a portion of the first electrode and the second electrode overlap the opening. A transmission element is provided that is relatively rigid compared to the second substrate and dimensioned to fit within a perimeter of the opening. The transmission element is physically coupled to the second electrode such that a force biasing the transmission element causes the second electrode to deflect relative to the first electrode, thus changing the variable capacitance. A measurement of the variable capacitance can be used to determine force information regarding the force biasing the transmission element.

In one specific embodiment, the input device and method are implemented with capacitive sensor electrodes. In such an embodiment, the capacitive sensor electrodes may be configured to determine positional information for objects that are in a sensing region. In various implementations, the capacitive sensor electrodes may be implemented on the first substrate, second substrate and/or third substrate. These implementations offer potential advantages of sharing components between the proximity sensor and the force sensor. Stated another way, these implementations allow force sensing to be added to a proximity sensor with relatively low additional cost and complexity.

What is claimed is:

1. An input device including a force sensor and a touchpad, the input device comprising:
   a first force electrode disposed on a first substrate;
   a second force electrode coupled to a second substrate, the second force electrode overlapping the first force electrode to form a first variable capacitance;
   a third force electrode disposed on the first substrate;
   a fourth force electrode coupled to the second substrate, the fourth force electrode overlapping the third force electrode to form a second variable capacitance;
   a third substrate arranged between the first substrate and the second substrate with a first opening between at least a portion of the first force electrode and at least a portion the second force electrode, and a second opening between at least a portion of the third force electrode and at least a portion the fourth force electrode;
   a transmission element physically coupled to the second substrate and configured such that force biasing the transmission element causes the second force electrode to deflect relative to the first force electrode to thereby change the first variable capacitance;
   the touchpad comprising a first plurality of capacitive sensor electrodes disposed on the first substrate, the first plurality of capacitive sensor electrodes configured to detect objects in a sensing region disposed between the first opening and the second opening; and
   a processing system conductively coupled to the first force electrode, the second force electrode, the third force electrode, the fourth force electrode, and the first plurality of capacitive sensor electrodes, the processing system configured to determine a first capacitance value of the first variable capacitance and a second capacitance value of the second variable capacitance, the processing system being further configured to determine force information using the first and second capacitance values;
   wherein the processing system is further configured to determine positional information of objects in the sensing region using the first plurality of capacitive sensor electrodes.

2. The input device of claim 1 further comprising a vent, the vent facilitating gas flow when the second force electrode is deflected relative to the first force electrode.

3. The input device of claim 1 wherein the second substrate comprises polyimide, polyethylene terephthalate, or polycarbonate, and wherein the first substrate comprises a material selected from a group consisting of polyimide, polyethylene terephthalate, polycarbonate, fiberglass, poly(methyl methacrylate), and glass.

4. The input device of claim 1, wherein the processing system is further configured to determine the first variable capacitance by driving the first force electrode with a first sensing signal modulated relative a system ground, driving the second force electrode with a constant potential, and measuring the first variable capacitance from the first force electrode.

5. The input device of claim 1 wherein the transmission element is configured to overlap at least a portion of the second force electrode and wherein the transmission element is further dimensioned to at least partially overlap the first opening.

6. The input device of claim 5,
wherein the processing system is further configured to determine the first variable capacitance by driving the first force electrode with a sensing signal modulated relative a system ground, receiving a resulting signal on the second force electrode, and determining the first variable capacitance from the second force electrode.

* * * * *